United States Patent
Modeeparampil et al.

(10) Patent No.: US 8,491,820 B2
(45) Date of Patent: Jul. 23, 2013

(54) PROCESS FOR GROWING AN ELECTRON INJECTION LAYER TO IMPROVE THE EFFICIENCY OF ORGANIC LIGHT EMITTING DIODES

(75) Inventors: Kamalasanan Narayanan Modeeparampil, New Delhi (IN); Ritu Srivastava, New Delhi (IN); Rakhi Grover, New Delhi (IN); Sundeep Kumar Dhawan, New Delhi (IN); Suresh Chand, New Delhi (IN); S. S. Bawa, New Delhi (IN)

(73) Assignee: Council of Scientific and Industrial Research, New Delhi (IN)

( * ) Notice: Subject to any disclaimer, the term of this patent is extended or adjusted under 35 U.S.C. 154(b) by 233 days.

(21) Appl. No.: 13/077,029

(22) Filed: Mar. 31, 2011

(65) Prior Publication Data
US 2012/0007056 A1 Jan. 12, 2012

(51) Int. Cl.
- H01B 1/00 (2006.01)
- H01J 1/62 (2006.01)
- H01L 29/08 (2006.01)
- B32B 27/32 (2006.01)

(52) U.S. Cl.
USPC .............. 252/500; 313/504; 257/40; 428/220

(58) Field of Classification Search
USPC .............. 252/500; 313/504; 257/40; 418/220
See application file for complete search history.

(56) References Cited

U.S. PATENT DOCUMENTS

| | | | |
|---|---|---|---|
| 4,803,011 A * | 2/1989 | Barraud et al. | 252/500 |
| 2007/0120136 A1* | 5/2007 | Noda et al. | 257/98 |
| 2007/0210705 A1* | 9/2007 | Yokoi et al. | 313/506 |
| 2011/0240980 A1* | 10/2011 | Wei et al. | 257/40 |

OTHER PUBLICATIONS

Grover, R. et al., "Percolation dominated electron transport in Tetracyanoquinodimethane mixed 4,7-diphenyl-1,10-phenanthroline thin films," Organic Electronics 13 pp. 3074-3078 (2012).*

* cited by examiner

*Primary Examiner* — Mark Kopec
*Assistant Examiner* — Jaison Thomas
(74) *Attorney, Agent, or Firm* — Ohlandt, Greeley, Ruggiero & Perle, LLP (57) ABSTRACT

An organic light emitting functional device with organic electron injection layer to improve the injection of electrons from the cathode in an organic light emitting diode. In particular, the device relates to the use of electron transport layer 4,7-diphenyl-1,10 phenanthroline (herein after called as BPhen) and another organic semiconductor Tetracyano quino dimethane (herein after called as TCNQ) and optimizing the thickness and doping percentage of the composition in an organic light emitting device. The main use of the composed injection layer is to balance the injection of holes from the anode side and the injection of electrons from cathode side and thus increase the efficiency of Organic light emitting diodes.

12 Claims, 6 Drawing Sheets

PROCESS FOR GROWING AN ELECTRON INJECTION LAYER TO IMPROVE THE EFFICIENCY OF ORGANIC LIGHT EMITTING DIODES

BACKGROUND

1. Field of the Invention

The present disclosure relates to an organic light emitting functional device with organic electron injection layer to improve the injection of electrons from the cathode in an organic light emitting diode. The present disclosure particularly relates to the use of commonly employed electron transport layer 4,7-di phenyl-1,10 phenanthroline (herein after called as BPhen) and another organic semiconductor Tetracyano quino dimethane (herein after called as TCNQ) and optimizing the thickness and doping percentage of the composition in an organic light emitting device.

2. Discussion of the Background Art

Balanced injection and transport of charge carriers from both the electrodes i.e. cathode as well as anode side is crucial for highly efficient OLEDs. The choice of these charge transport and charge injection layers is also an important issue. The large interface barrier offered by charge injection layers results in increased potential drop across these layers. Since OLEDs are current driven devices and large current passes through these devices, these potential drops results in energy loss and efficiency loss. Further large potential drop across these layers causes Joule heating resulting in device failure. Therefore, efficient organic materials based devices require reduction of barrier faced by the charge carriers while traversing their path from the respective electrodes to the active layer of the device. For this purpose, several attempts have been made either by using electron injecting buffer layers for the ease of injection of electrons from the cathode or by using low work function cathode.

Reference may be made to U.S. Pat. No. 4,885,211 wherein the cathode is comprised of a layer of a plurality of metals, other than alkali metals, like Ag, Al, Mn, Cu, Au, Sn, In etc.

Reference may be made to U.S. Pat. No. 5,776,622 wherein a bilayer electrode which comprises of a fluoride layer contacting the emissive layer and a conductive layer contacting the fluoride layer.

Reference may be made to U.S. Pat. No. 6,140,763 wherein doped cathode (Li doped Al) has been used as interfacial electron injection layer.

The use of low work function cathode can effectively improve the electron injection but such metals are too reactive and react readily with water and oxygen and thus affect stability of the device. Another method is to use an electron injection layer between the cathode and the electron transport layer which is usually composed of n-type doped electron transport materials.

To facilitate the injection of electrons from the cathode side, n-type doping with alkali metals is also done (Zugang Liu, O. V. Salata, Nigel Male; "Improved electron injection in organic LED with lithium quinolate/aluminium cathode"; Synthetic Metals, Volume 128, Issue 2, 30 Apr. 2002, Pages 211-214).

Reference may be made to U.S. Ser. No. 10/173,682 and, EP1648042 wherein the fabrication of organic light emitting diodes has been carried out by employing n-type doping with alkali metals to facilitate the injection of electrons from cathode side.

Reference may be made to U.S. Pat. No. 7,070,867B2 which discloses OLEDs having n-type doping.

Reference may be made to U.S. Pat. No. 7,507,649—wherein Cs has been doped into BPhen to enhance electron injection.

Reference may be made to patent US2007/0034864A1 wherein a buffer structure is disposed between the organic layer and the cathode. This buffer structure consists of two layers, a first layer containing an alkali halide over the electron transport layer and a second buffer layer containing a metal/metal alloy is provided over the first buffer layer.

Reference may be made to IPC8: AH01J162FI, USPC Class: 313504: Nov. 13, 2008 wherein a mixed electron-transporting layer including 4,7-diphenyl-1,10-phenanthroline known as Bphen and tris (8-quinolinolato) aluminum (III) (Alq) as co-host, with 2% Li metal has been employed and Yasuhisa Kishigami, Kenji Tsubaki, Yukihiro Kondo and Junji Kido; "White Organic Electroluminescent Devices Having a Metal-Doped Electron Injection Layer" (Super-Functionality Organic Devices IPAP Conf. Series 6 pp. 104-107), Proc. Int. Symp wherein White Organic Electroluminescent Devices having a Cs doped BPhen electron injection layer has been proposed.

$Alq_3$, phenanthroline and other electron transporting materials have been successfully doped with Li to significantly enhance their conductivity. [(a) "Lithium doping of semi conducting organic charge transport materials." Parthasarathy G., Shen C., Kahn A., Forrest S. R. J. Appl. Phys. (2001), 89(9), 4986 4992. (b) "Low-voltage inverted transparent vacuum deposited organic light-emitting diodes using electrical doping." Zhou X., Pfeiffer M., Huang J. S., Blochwitz-Nimoth J., Qin D. S., Werner A., Drechsel, J., Maennig B., Leo K., Appl. Phys. Lett. (2002), 81(5), 922 924, (c) US patent 2006/0251922A1 wherein two electron injection layers have been used, where first electron injection layer is Alq+1.2 vol %. Li and second is HATCN (d) "Efficient multilayer organic light emitting diode" Liu Z., Pinto J., Soares J., Pereira E., Synthetic Metals (2001), 122(1), 177-179 (e) "Electron structure of tris (8-hydroxyquinoline) aluminum thin films in the pristine and reduced states." Johansson N., Osada T., Stafstrom S., Salaneck W. R., Parente V., Dos Santos D. A., Crispin X., Bredas J. L., J. Chem. Phys. (1999), 111(5), 2157 2163. (f) "Bright organic electroluminescent devices having a metal-doped electron-injecting layer." Kido Junji, Matsumoto, Toshio, Appl. Phys. Lett. (1998), 73(20), 2866 2868]. Reference may be made to patent US2006/0269782 wherein Bphen+1.2 vol % Li and Alq+1.2 vol % Li serve as an electron injection layer.

Reference may be made to patent US2003/0230980 wherein the n-doped layer comprises BPhen:Li (1:1) ratio, United States Patent 2008/0227357 wherein LiF is used an electron injection layer to balance the charge carrier injection from cathode and anode respectively and Lian Duan, Qian Liu, Yang Li, Yudi Gao, Guohui Zhang, Liduo Wang, Yong Qiu ("Thermally decomposable Lithium Nitride as an electron injection material for highly efficient and stable OLEDs", J. Phys. Chem. C 2009, 113, 13386-13390).

Reference may be made to U.S. Pat. No. 5,677,572 wherein a non-conducting layer such as LiF and MgO has been used between Alq and Al to improve the electron injection. US patent 2008/0093981A1 which proposes a buffer electron injection layer between cathode and emissive layer that is a composition containing molar ratio of benzoxazole derivative (electron acceptor) to an electron donating compound (for example TTF), Szu-Yi Chen, Ta Ya Chu, Jenn Fang Chen, Chien Ying Su ("Stable inverted bottom-emitting organic electroluminescent devices with molecular doping and morphology improvement" Applied Physics Letters 89, 053518, 2006), Xiang Zhou, Martin Pfeiffer, Jing S. Huang, Jan Blochwitz, Ansgar Werner, and Karl Leo ("Inverted OLEDs with Electrically Doped Carrier Injection and Transport Layers" Mat. Res. Soc. Symp. Proc. Vol. 725, 2002 Materials Research Society) where Li doped BPhen is used as an ETL and U.S. Pat. No. 7,501,755B2 wherein electron injection layer is represented by the formula $A_xB_yO_z$ where A is an alkali metal/alkaline earth metal and B is a group VIII metal ($0<x<=2$, $0<y<=3$, $0<z<=6$, for example $LiNiO_2$, $LiCoO_2$).

The drawbacks of these attempts are that the metals in organic semiconductors interfere with luminescence properties. Metal atoms being highly mobile readily diffuse through organic materials leading to degradation due to formation of trapping centres and quenching sites. Also particularly, there are two potential drawbacks of doping with Li. The first drawback of Li doping is that the number of free carriers generated by Li doping is far less than the amount of Li that is doped into the film (carriers/Li<10%). The low yield of free carriers is thought to be due to the formation of charge transfer complexes, or tightly bound ion pairs ["Investigation of the interface formation between calcium and tris-(8-hydroxy quinoline) aluminum." Choong V.-E.; Mason, M. G.; Tang, C. W.; Gao Yongli; Appl. Phys. Lett. (1998), 72(21), 2689-2691]. A second problem of Li doping is that Li may be highly mobile, readily diffusing throughout a device. Li diffusion into layers that are not meant to be redox doped leads to marked degradation of device performance due to the formation of trapping or quenching sites. Clearly the problems with Li doping are related to its high charge density and small size. Also Lithium is sensitive to oxidation. Apart from this, these attempts also require the handling of reactive metals. These metals are chemically reactive and are susceptible to atmospheric oxidation and corrosion also. Fabrication of the organic based device can only be carried out at considerably high temperatures in case alkali metals are used as n-type dopants. Furthermore, it requires a high doping ratio which in turn alters the matrix properties. Furthermore in the case of LiF, due to its high electrical insulation, its deposition as an electron injection layer in OLEDs has a thickness restriction (less than 1 nm), which is difficult to control.

Not withstanding these developments, there remains a need for efficient and stable electron injecting material to be used as a buffer layer between the cathode and the electron transport layer. 4,7-di Phenyl-1,10 Phenanthroline (BPhen) has been widely used in organic semiconductors based devices as an electron transporting as well as hole blocking layer. (US Patent No 20050074629, U.S. Pat. 7,179,543), ("Efficient and extremely long-lived organic light-emitting diodes based on dinaphthylperylene"; Viktor V. Jarikov, Denis Y. Kondakov, Christopher T. Brown; J. Appl. Phys. 102, 104908 (2007)), ("Efficient white organic light-emitting devices using 4,7-diphenyl-1,10-phenanthroline as block layer; Huishan Yang, Yanwei Shi, Yi Zhao, Jingying Hou and Shiyong Liu; Journal of Luminescence, vol 128, Issue 2, Pages 367-370) and many others. In addition to the above, extra thickness of insulating LiF which blocks electron injection can cause much problem when LiF is used in electron transport layer. The main object of the present disclosure is to provide an organic light emitting functional device with organic electron injection layer.

Another objective of the present disclosure is to provide an electron injection layer composed of most commonly used electron transport material 4,7 di phenyl 1,10 phenanthroline (BPhen) doped with another organic semiconductor Tetracyano quino dimethane (TCNQ).

Yet another object is to provide an electron injecting layer which is composed of only organic based materials and thus does not require metallic dopants.

Still another object of disclosure is to provide an electron injection layer which does not require high deposition temperature compared to that of alkali metals doping and requires a considerably low and practical amount of doping. Yet another object of disclosure is that the electron injection layer can be deposited uniformly with a thickness of 15 Å or 20 Å.

Another object of the present disclosure is to fabricate highly efficient multilayered organic light emitting diodes using this electron injection layer which will be useful in display applications as well as general lighting applications.

Another object of the present disclosure is to fabricate stable organic light emitting functional device with organic electron injection layer compared to usually employed n-type dopants containing LED.

SUMMARY

Accordingly, the present disclosure relates to an organic light emitting functional device with organic electron injection layer to improve the injection of electrons from the cathode in an organic light emitting diode. A composition of commonly used and commercially available electron transport material 4,7-di phenyl-1,10 phenanthroline (BPhen) and another organic semiconductor Tetracyano quino dimethane (TCNQ) have been selected to improve the injection of electrons from cathode in organic light emitting diodes.

Figure 1:
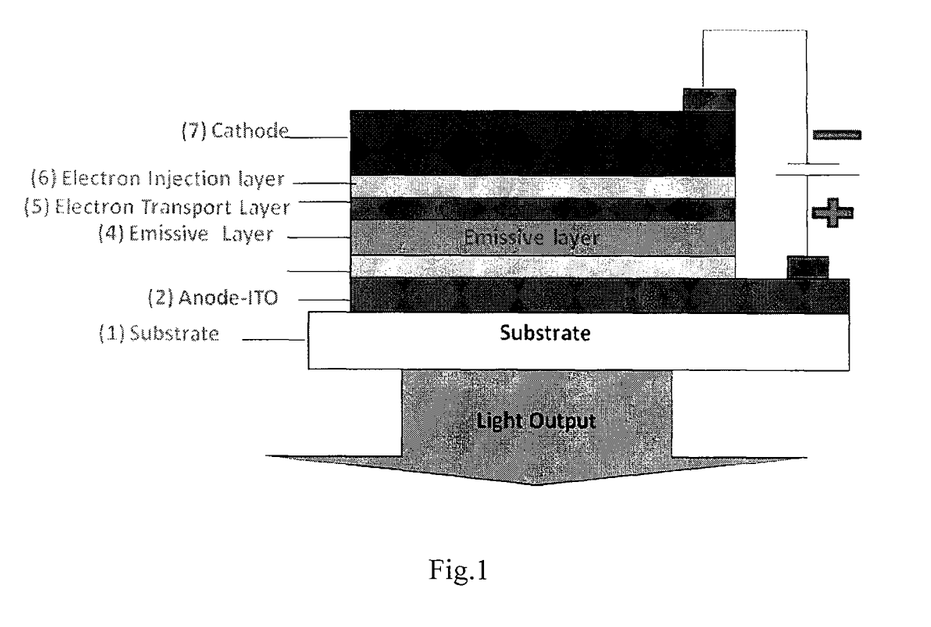
FIG. 1: represents the device configuration

In an embodiment of the present disclosure an organic light emitting functional device comprising of a substrate (1) composed of glass, an anode layer (2) composed of indium tin oxide superimposed on a substrate layer (1), a hole transport layer (3) deposited on anode (2), the said hole transport layer (3) being covered by an organic emissive layer (4) and an electron transport layer (5) covering the emissive layer (4) followed by an electron injection layer (6) made up of organic semiconductors and further the circuit is completed by superimposing a cathode (7) composed of aluminum over the said electron injection layer (6).

In another embodiment of the present disclosure the electron injection layer used is 20% tetracyano quino dimethane (TCNQ) doped 4,7-di phenyl-1,10 phenanthroline (Bphen) for efficient organic light emitting diode.

In another embodiment of the present disclosure the thickness of the optimally doped electron injection layer is in the range of 10 Å to 20 Å.

In another embodiment of the present disclosure the hole transport layer is selected from the group consisting of aromatic diamines.

In another embodiment of the present disclosure the aromatic diamine used is 0.4% 2,3,5,6 tetrafluoro-7,7,8,8 tetracyano quino dimethane ($F_4$ TCNQ) doped α-N,N-di-1-napthalenyl-N,N-diphenyl-di-1,1 biphenyl-4,4-diamine (α-NPD).

In another embodiment of the present disclosure the organic emissive layer is made up of green emitting $Ir(PPY)_3$ selected from the group of phenyl pyridine complexes.

In another embodiment of the present disclosure the electron transport layer is made up of 4,7-di phenyl-1,10 phenanthroline (Bphen).

In another embodiment of the present disclosure the thickness of the electron transport layer is optimized to be 100 Å.

In another embodiment of the present disclosure an organic light emitting functional device provides luminance of 1320 ($cd/m^2$) and power efficiency of 4.21 (Lm/W) AT 15 v with an operating voltage of 7.9 V.

DETAILED DESCRIPTION OF THE PREFERRED EMBODIMENT

Generally, an OLED comprises of at least one organic layer disposed between and electrically connected to an anode and a cathode. When a forward bias is applied, the anode injects holes and the cathode injects electrons into the organic layer(s). The injected holes and electrons each migrate toward the oppositely charged electrode. When the electron and hole localize on the same molecule, an "exciton" which is a localized electron-hole pair having an excited energy state, is formed. Light is emitted when the exciton relaxes via a photo emissive mechanism.

The electron injection layer may be selected such that electrons can be efficiently injected from the cathode into the LUMO (Lowest Unoccupied Molecular Orbital) level of the electron transport layer. Generally, injection layers are comprised of a material that may improve the injection of charge carriers from one layer, such as an electrode or an organic layer, into an adjacent organic layer. Injection layers may also perform a charge transport function.

In particular, so as to achieve high electron injection efficiency, the work function of the cathode material is preferably not greater than the electron affinity of the electron injection layer by more than about 0.75 eV, more preferably, by not more than about 0.5 eV. Similar considerations apply to any layer into which electrons are being injected.

The present disclosure, an electron injecting material will be deposited on a multilayered structure to form Organic Light Emitting Diode and the deposited organic layer will be forming a highly injecting contact with low work function electrodes like Aluminum. The disclosure will be useful in the fabrication of very highly efficient Organic Light Emitting Diodes which can be used in display applications as well as general lighting applications.

The present disclosure relates to an organic semiconductor dopant (TCNQ) to be doped into well known electron transport layer (BPhen) so that the composition serves as an electron injection layer with an optimized thickness as well as optimized doping concentration of the dopant.

The present disclosure describes the process in which an organic semiconductor Tetracyano quino dimethane (TCNQ) is doped in 4,7 di phenyl 1,10 phenanthroline (BPhen) to provide an electron injection layer and the deposited organic layer will be forming a highly injecting contact with Aluminum.

The Process of this Disclosure Involves i) Firstly, a composition of the organic semiconductors 4,7 di phenyl 1,10 phenanthroline (BPhen) and Tetracyano quino dimethane (TCNQ) has been selected for the purpose of electron injection layer. BPhen is readily being used as an electron transport layer in organic based devices due to its good electron transporting ability and also the good hole blocking ability. TCNQ is having its LUMO energy level lying between LUMO level of BPhen and work function of Aluminum which is being used as a cathode and thus providing enough energy states for the electrons being injected from cathode into the TCNQ doped Bphen film at particular doping concentrations) (TCNQ: HOMO and LUMO values are 8.3 eV and 5.1 eV respectively, Bphen: HOMO and LUMO values are 6.0 eV and 2.9 eV respectively). However, in another embodiment compound Alq3 (Tris(8-hydroxyquinolinato) aluminium) and BAlq Al (iii) bis(2-methyl-8-quinolinolato)(para-phenyl-phenolato) can also be used for electron transport layer. Also, any metal like Ca, Mg which have low work function can be used as cathode.

ii) Secondly, the fabrication of a series of electron only devices with the configuration Al/BPhen(100−$x$)%+TCNQ($x$)%/Al where the concentration of the dopant '$x$' Tetracyano quino dimethane (TCNQ) was varied as 0%, 0.4%, 0.8%, 4%, 10%, 20% for a fixed thickness of 150 nm of the composition in the device. The current density decreases for low doping concentrations 0.4% and 0.8% as compared to the pure one where no dopant is added. As the doping concentration increases further, the injection process is facilitated due to the increased availability of energy states for the electrons in the proposed film and the current density increases. Doping concentration of 20% was found to be highly efficient among all the tried concentrations in the electron only devices.

iii) Thirdly, the thin layers of the optimized percentage of dopant TCNQ (20%) in BPhen were tried finally to improve the injection of electrons compared to pure Bphen based electron only device. The device configurations are mentioned below:

Al/BPhen/Al

Al/20% TCNQ doped BPhen/BPhen/20% TCNQ doped BPhen/Al

Here the improved injection as compared to the device without injection layer further proves the use of doped BPhen as an electron injection layer.

iv) The highly efficient percentage of doping of 20% (as optimized in electron only devices) has been used to fabricate the Organic light emitting Diodes in which thickness of the composition was optimized among the various tried thicknesses of 300 Å, 100 Å, 20 Å, 15 Å, 10 Å. The complete device structure is mentioned below:

ITO/HTL/EML/BPhen/doped BPhen(300 Å–10 Å)/Al where HTL and EML are the hole transporting and emissive layers used in the device. Here BPhen served as the electron transporting layer and different thicknesses of 20% doped BPhen were tried as electron injection layers. A thickness of 15 Å for doped BPhen was found to be highly efficient EIL for an OLED.

v) The Organic light emitting Diodes were fabricated with doped BPhen (with varying concentration of the dopant TCNQ) as an electron injection layer in the configuration mentioned below.

ITO/HTL/EML/BPhen/doped BPhen/Al

Where HTL and EML are the hole transporting and emissive layers used in the device. BPhen was used as electron transporting layer and doped BPhen represents:

BPhen(100−x)%+TCNQ(x)% where the concentration of the dopant 'x' Tetracyano quino dimethane (TCNQ) was varied as 4%, 10%, 20% for a fixed thickness of 15 Å (as optimized in step (iv) above) of the composition (as EIL) in the device. Doping concentration of 20% was found to be highly efficient among all the tried configurations in the organic light emitting device also.
(The purpose was to confirm the doping concentration of TCNQ in BPhen particularly in an organic light emitting diode as done in the case of electron only devices (as in step (i) and (ii) above))

vi) The thickness of pure BPhen as an electron transport layer used just before the proposed electron injection layer was then optimized to be 100 Å in the same device configuration as mentioned in step (v) above.

vii) Finally, Organic light emitting diode was fabricated by using the optimized doping concentration of TCNQ in BPhen and optimized thicknesses of pure BPhen and TCNQ doped BPhen as electron transport layer and electron injection layer respectively.

The main use of the composed injection layer is to balance the injection of holes from the anode side and the injection of electrons from cathode side and thus increase the efficiency of Organic light emitting diodes.

EXAMPLES

The following examples are given by way of illustration and therefore should not be construed to limit the scope of the present disclosure.

Example 1

Electron only devices were prepared using doped BPhen (1500 Å thick) as the basic organic material with the configuration given below.

Al/BPhen(100−x)%+TCNQ(x)%/Al where the concentration of the dopant (TCNQ) was varied as 0%, 0.4%, 0.8%, 4%, 10%, 20% for a fixed thickness (1500 Å) of the composition. These electron only devices were fabricated on plain glass substrates. Substrates were sequentially cleaned by solvents and then dried in a vacuum oven. After that they were immediately loaded into a vacuum thermal evaporation system operated at a base pressure of $10^{-5}$ Torr.

(a) A thick layer (more than 2000 Å) of Aluminum was deposited first through a shadow mask.

(b) Then 1500 Å thick organic layer of pure or doped BPhen was grown as per the requirement as shown above.

(c) Then a thick layer of Aluminum (more than 2000 Å) was deposited again on top of the organic layer through a shadow mask.

Six devices were fabricated:

Al/BPhen/Al

Al/0.4% TCNQ doped BPhen(1500 Å)/Al

Al/0.8% TCNQ doped BPhen(1500 Å)/Al

Al/4% TCNQ doped BPhen(1500 Å)/Al

Al/10% TCNQ doped BPhen(1500 Å)/Al

Al/20% TCNQ doped BPhen/Al.

The active area of the devices was 4 mm by 4 mm (pixel area).

These electron only devices were evaluated with positive and negative potential applied to top and bottom electrodes of aluminum. The injection property of metal on organic and organic on metal was verified by reversing the biasing which was found to be within experimental error. Current density Vs voltage (J–V) measurements have been performed on these devices using a Keithley 2400 programmable digital source meter.

The doping concentration of TCNQ in BPhen was optimized to be 20% (among different tried doping concentrations) which gave the highest current density for a given value of voltage (as shown in FIG. 1 at room temperature).

Example 2

Electron only device was fabricated as explained in Example 1 using 20% TCNQ doped BPhen as an electron injection layer. The device configuration is given below:

Al/20% TCNQ doped BPhen(15 Å)/BPhen(1500 Å)/20% TCNQ doped BPhen(15 Å)/Al.

a. A thick layer (more than 2000 Å) of Aluminum was deposited over the glass substrates through a shadow mask.

b. Then a 15 Å thick organic layer of 20% TCNQ doped BPhen was deposited (to serve as an electron injection layer).

c. A 1500 Å thick layer of pure BPhen was deposited as the basic organic material.

d. Then again a 15 Å thick organic layer of 20% TCNQ doped BPhen was deposited (to serve as an electron injection layer).

e. Then a thick layer of Aluminum (more than 2000 Å) was deposited again on top of the organic layers through a shadow mask.

Figure 2:
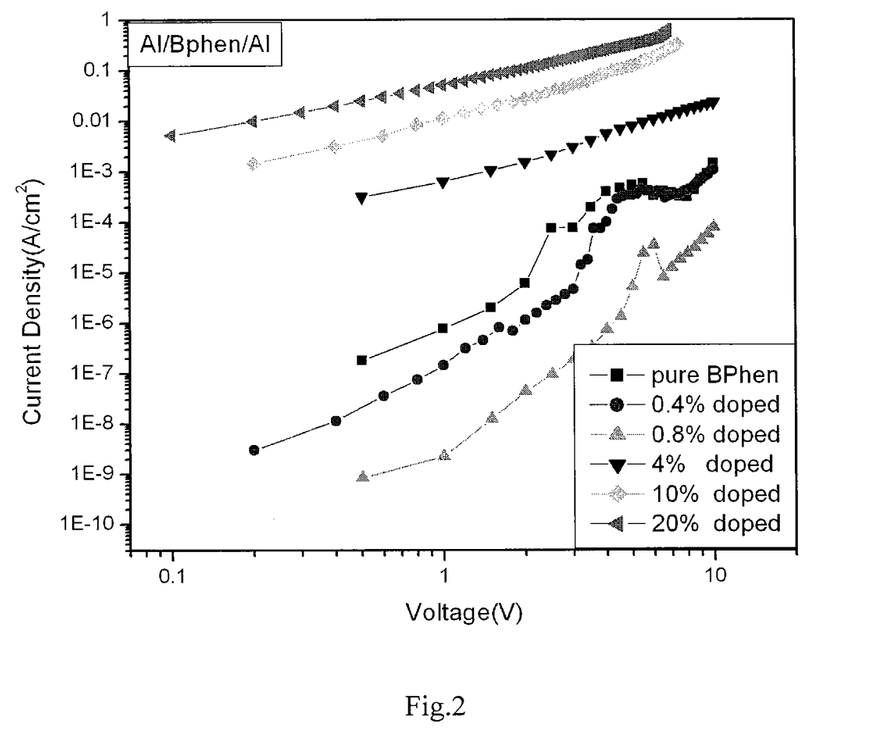
FIG. 2: represents a graph showing Current Density vs. Voltage curves for different tried doping concentrations of the composition proposed (in electron only devices).

The electron only device was evaluated with positive and negative potential applied to top and bottom electrodes of aluminum. The injection property of metal on organic and organic on metal was verified by reversing the biasing which was found to be within experimental error. Current density Vs voltage (J–V) measurements have been performed on the device using a Keithley 2400 programmable digital source meter. Current density increases for a given value of voltage when 20% TCNQ doped Bphen is used as an EIL as compared to the case when no EIL was used (as shown in FIG. 2 at room temperature).

Example 3

The Organic light emitting diodes satisfying the requirements of the disclosure were fabricated by using different thicknesses of 20% doped BPhen (as optimized in electron only devices) as an electron injection layer in the configuration mentioned below.

ITO/0.4% $F_4$-TCNQ doped α NPD/5% Ir$(ppy)_3$ doped CBP/BPhen/20% TCNQ doped BPhen/Al Indium-tin oxide (ITO) (thickness of 120 nm) coated glass substrates with a sheet resistance 20 Ω/square (Vin Karola, USA) were patterned and cleaned sequentially using deionized water, acetone, trichloroethylene, and isopropyl alcohol for 20 min each using an ultrasonic bath. Prior to film deposition, the surface of ITO substrate was treated with oxygen plasma for 5 min to enhance its work function. All the organic films were deposited under a vacuum of $10^{-5}$ Torr. The thicknesses of these films were measured in situ by a quartz crystal thickness monitor. Firstly 0.4% $F_4$-TCNQ doped α NPD as hole transport layer was deposited with a thickness of 300 Å and thereafter the green emissive layer 5% Ir (ppy)$_3$ doped CBP was deposited with a thickness of 500 Å and over that 300 Å BPhen was deposited. Varying thicknesses of 20% TCNQ doped BPhen were deposited as an electron injection layer. Finally a thick layer of Aluminum was deposited again on top of the organic layer through a shadow mask. The active area of the device was 4 mm by 4 mm Five devices were fabricated:

(a) The electron injection layer (20% TCNQ doped BPhen) was deposited with a thickness of 100 Å.
(b) The electron injection layer (20% TCNQ doped BPhen) was deposited with a thickness of 20 Å.
(c) The electron injection layer (20% TCNQ doped BPhen) was deposited with a thickness of 15 Å.
(d) The electron injection layer (20% TCNQ doped BPhen) was deposited with a thickness of 10 Å.
(e) The electron injection layer (20% TCNQ doped BPhen) was deposited with a thickness of 0 Å (i.e. no injection layer was used at all).

Figure 3:
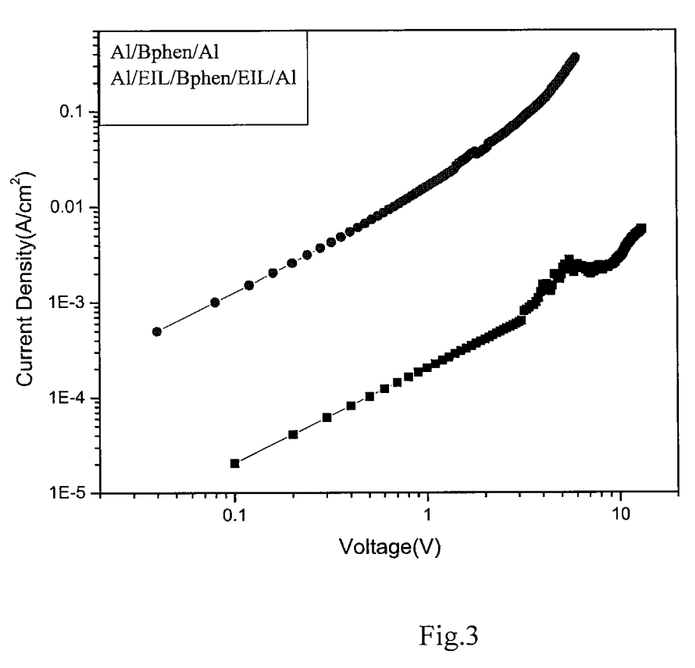
FIG. 3: represents a graph showing Current Density vs Voltage curves for the pure BPhen based electron only devices with and without using 20% TCNQ doped BPhen as an electron injection layer.
Figure 4:
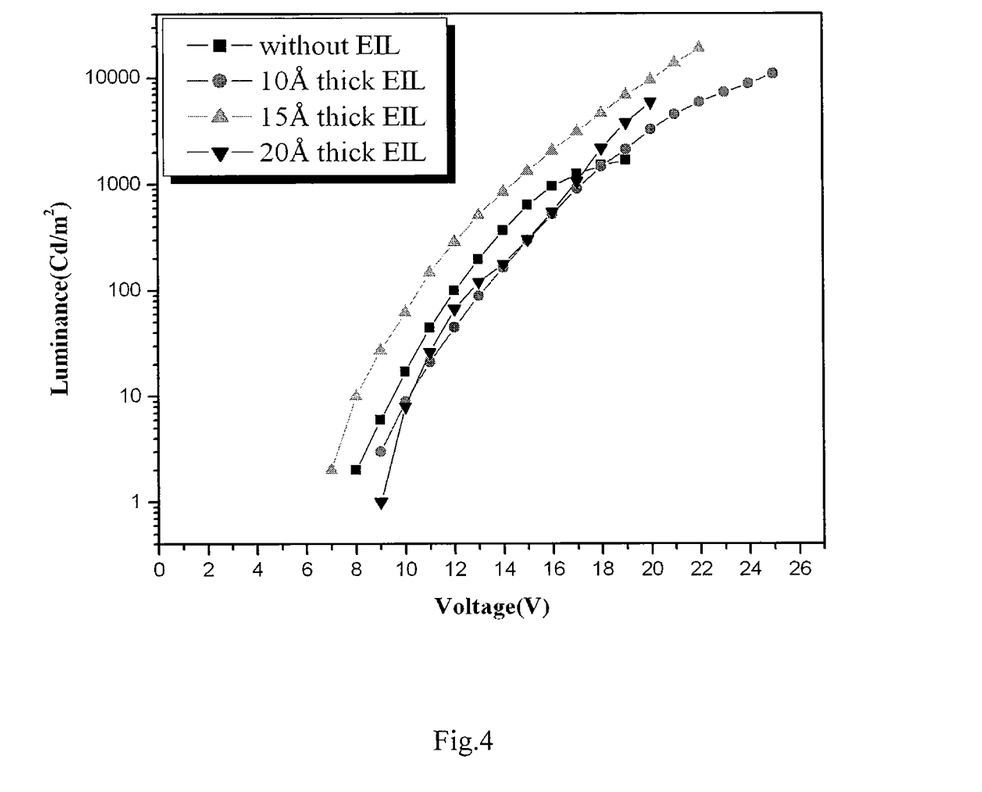
FIG. 4: represents a graph showing Luminance vs Voltage curves for the OLEDs with different thicknesses of 20% dopant based composition as EIL.
Figure 5:
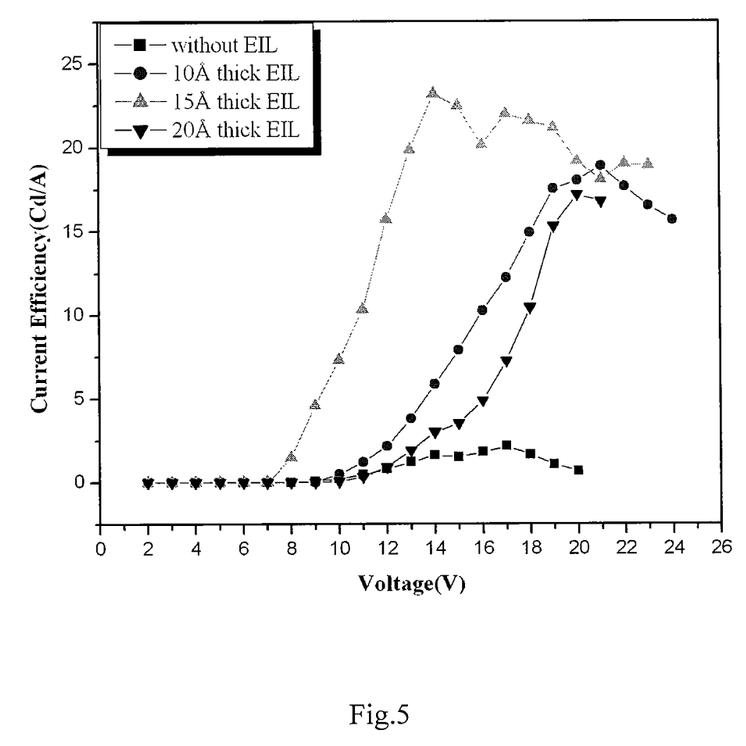
FIG. 5: represents a graph showing Current efficiency vs Voltage Curves for the OLEDs with different thicknesses of 20% dopant based composition as EIL.
Figure 6:
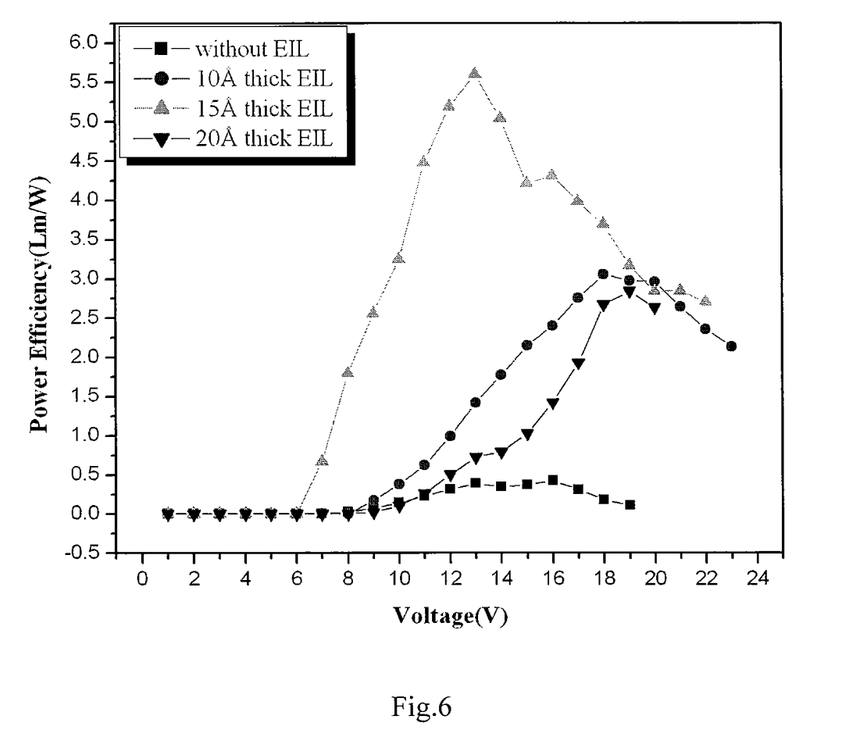
FIG. 6: represents a graph showing Power efficiency vs Voltage Curves for the OLEDs with different thicknesses of 20% dopants based composition as EIL.

All the devices were characterized using Keithley 2400 programmable digital source meter, luminance meter (LMT 1-1009) and high resolution spectrometer (Model No. HR-4000, Ocean Optics Inc.). All the devices gave green emission (at 550 nm). Out of the above devices, device (a) required a drive voltage of about 13V to pass 20 mA/cm$^2$, however there was no light emission from this device which indicates that 100 Å thick films of 20% TCNQ doped BPhen films cannot be used as an effective injection layer (which can be attributed to inefficient charge balance). The turn on voltages of the devices (b), (c) and (d) were 10.1V, 7.9V and 10.0V respectively at a luminance of 10 cd/m$^2$. The device where no injection layer was used at all required 9.5V to give a luminance of 10 cd/m$^2$. Also, the device (c) gave highest luminescence, current efficiency and power efficiency as compared to the device where no EIL was used at all, as shown in FIGS. 3, 4 and 5. The data is as shown in table 1 below:

| Thickness of EIL | Operating Voltage (V) | Power Efficiency (Lm/W) at 15 V | Luminance (cd/m$^2$) at 15 V | Current Efficiency (Cd/A) at 15 V |
|---|---|---|---|---|
| No EIL | 9.5 | 0.38 | 634 | 1.51 |
| 10 Å | 10.0 | 2.15 | 295 | 7.90 |
| 15 Å | 7.9 | 4.21 | 1320 | 22.5 |
| 20 Å | 10.1 | 1.03 | 303 | 3.53 |

Example 4

The process of fabrication and measurement was similar as explained in example 3 above, except that varying concentrations of the dopant TCNQ with a thickness of 15 Å (as optimized in example 3) above were used as an electron injection layer in the configurations mentioned below:

(a) ITO/0.4% F$_4$-TCNQ doped α NPD/5% Ir (ppy)$_3$ doped CBP/BPhen/4% TCNQ doped BPhen/Al.
(b) ITO/0.4% F$_4$-TCNQ doped α NPD/5% Ir (ppy)$_3$ doped CBP/BPhen/10% TCNQ doped BPhen/Al
(c) ITO/0.4% F$_4$-TCNQ doped a NPD/5% Ir (ppy)$_3$ doped CBP/BPhen/20% TCNQ doped BPhen/Al All the devices were characterized using Keithley 2400 programmable digital source meter, luminance meter (LMT 1-1009) and high resolution spectrometer (Model No. HR-4000, Ocean Optics Inc.). All the devices gave green emission (at 550 nm). Out of above three devices, device (c) with 20% TCNQ doped BPhen gave noticeable values of Luminance. The driving voltage of the device (c) was 7.9V volts at a luminescence of 10 cd/m$^2$ whereas the devices (a) and (b) required driving voltages of 15.3V and 13 V respectively to pass 20 mA/cm$^2$, however there was no recordable light emission from devices (a) and (b) which indicates that only 20% TCNQ doped BPhen films can be used as an effective injection layer out of the above devices.

Example 5

Then the thickness of pure BPhen (being used as an electron transport layer in the device) was optimized to be 100 Å (functioning as an electron transport layer in between electron injection layer and the emissive layer. The configuration is mentioned below:

ITO/0.4% F$_4$TCNQ doped α NPD(300 Å)/5% Ir(ppy)$_3$ doped CBP(500 Å)/BPhen/20% doped BPhen(15 Å)/Al The process of fabrication was similar as explained in example 4 above, except that 20% doped BPhen was used as EIL with a thickness of 15 Å (as optimized in examples 4 and 5 above). BPhen serving as ETL was deposited with varying thicknesses (300 Å and 100 Å). The 100 Å thick layer of BPhen gave the best result as an ETL. The device with 300 Å BPhen as an ETL required a turn on voltage of 7.9V whereas the device with 100 Å BPhen as an ETL required a turn on voltage of 7.2V.

Example 6

Finally highly efficient OLED were fabricated with above optimizations in the device structure mentioned below:

ITO/0.4% F$_4$TCNQ doped α NPD(300 Å)/5% Ir(ppy)$_3$ doped CBP(500 Å)/BPhen(100 Å)/20% doped BPhen(15 Å)/Al Operating voltage of the device was 7.2V with a luminance of 71 cd/m$^2$ at a voltage of 10V.

The process of fabrication was similar as explained in example 3 above.

ADVANTAGES OF THE DISCLOSURE

Efficient charge balance in organic light emitting diodes can be achieved with organic doping in electron injection layer (no metallic dopant is required).
It does not use high doping concentrations which could alter the matrix properties.
A highly injecting contact can be achieved at relatively low temperatures compared to that required in metal doping case.
A highly injected contact can be obtained which can be uniformly deposited with in a range of thicknesses unlike LiF layer which becomes an insulator above a thickness of 10 Å.
Careful handling of the reactive metals is not required which are usually used to enhance the electron injection in an organic semiconductor based device.
The composition would be quite stable compared to usually employed n-type dopants.
The composition described herein may have applications in devices other than OLEDs. For example, other optoelectronic devices such as organic solar cells and organic photo detectors may employ the materials and structures.

What is claimed is:

1. A composition for an electron injection layer for organic light emitting device, said composition comprising:
   4,7-di phenyl-1,10 phenanthroline (Bphen); and
   20% of tetracyano quino dimethane (TCNQ).

2. An organic light emitting device comprising among other layers an electron injection layer formed with a composition comprising:
   4,7-di phenyl-1, 10 phenanthroline (Bphen); and
   20% of tetracyano quino dimethane (TCNQ).

3. An organic light emitting device as claimed in claim 2, wherein the electron injection layer has a thickness in the range of 10 Å to 20 Å.

4. An organic light emitting device as claimed in claim 2, comprising:
   a substrate layer;
   an anode layer superimposed on the substrate layer;
   a hole transport layer deposited on the anode layer;
   an organic emissive layer covering the hole transport layer;
   an electron transport layer covering the organic emissive layer; and
   a cathode superimposed over the electron injection layer.

5. An organic light emitting device as claimed in claim 4, wherein the anode layer composed of indium tin oxide.

6. An organic light emitting device as claimed in claim 4, wherein the hole transport layer is selected from the group consisting of aromatic diamines.

7. An organic light emitting device as claimed in claim 6, wherein the aromatic diamines is 0.4% 2,3,5,6 tetrafluoro-7,7,8,8 tetracyano quino dimethane ($F_4$ TCNQ) doped α-N,N-di-1-napthalenyl-N,N-diphenyl-di-1,1 biphenyl-4,4-diamine (α-NPD).

8. An organic light emitting device as claimed in claim 4, wherein organic emissive layer is made up of green emitting Ir(PPY)$_3$ selected from a group consisting of phenyl pyridine complexes.

9. An organic light emitting device as claimed in claim 4, wherein the electron transport layer is made up of 4,7-di phenyl-1,10 phenanthroline (Bphen).

10. An organic light emitting device as claimed in claim 9, wherein the electron transport layer is 100 Å in thickness.

11. An organic light emitting device as claimed in claim 4, wherein the cathode is composed of aluminum.

12. An organic light emitting device as claimed in claim 2, wherein the electron injection layer is covering an electron transport layer.

* * * * *